United States Patent [19]

Scheying et al.

[11] 4,217,528

[45] Aug. 12, 1980

[54] APPARATUS FOR PREVENTING MALFUNCTION IN A CIRCUIT CONTROLLING AN ELECTRICAL COMPONENT MAINTAINING A RESIDUAL VOLTAGE AFTER REMOVAL OF ENERGIZATION

[75] Inventors: Hans Scheying, Leonberg; Richard Schleupen, Ingersheim, both of Fed. Rep. of Germany

[73] Assignee: Robert Bosch GmbH, Stuttgart, Fed. Rep. of Germany

[21] Appl. No.: 875,284

[22] Filed: Feb. 6, 1978

[30] Foreign Application Priority Data

Mar. 5, 1977 [DE] Fed. Rep. of Germany ....... 2709627

[51] Int. Cl.$^2$ .............................................. H02P 5/16
[52] U.S. Cl. ...................................... 318/293; 318/314
[58] Field of Search ............... 318/280, 287, 291, 293, 318/294, 314

[56] References Cited

U.S. PATENT DOCUMENTS 3,896,358   7/1975   Tanikoshi ............................ 318/314

FOREIGN PATENT DOCUMENTS 1188704  3/1965  Fed. Rep. of Germany .......... 318/293

*Primary Examiner*—J. V. Truhe
*Assistant Examiner*—W. E. Duncanson, Jr.
*Attorney, Agent, or Firm*—Frishauf, Holtz, Goodman & Woodward

[57] ABSTRACT

The direction of current through a motor is controlled by a bridge circuit having four transistors each constituting one arm of the bridge. A first and second transistor receive the control signal for allowing current flow in the first and second direction respectively. To prevent the emf of the motor which maintains the previous direction for a short time after the switching of the current direction, from maintaining a previously conductive transistor in the conductive state, a first diode is connected between the first motor output terminal and the control electrode of the third transistor and a second diode is connected between the second motor output terminal and the control electrode of the fourth transistor. The polarity of the diodes is such that the residual emf is blocked from the respective control electrodes.

9 Claims, 1 Drawing Figure

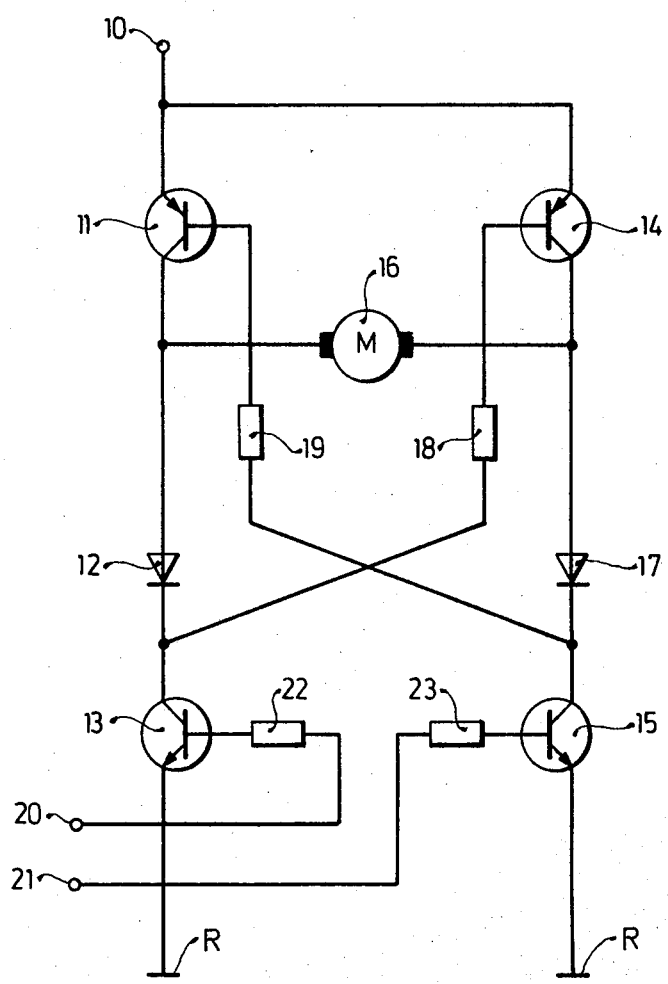

APPARATUS FOR PREVENTING MALFUNCTION IN A CIRCUIT CONTROLLING AN ELECTRICAL COMPONENT MAINTAINING A RESIDUAL VOLTAGE AFTER REMOVAL OF ENERGIZATION

The present invention relates to bridge circuits controlling an electrical component which maintains a residual voltage after termination of current therethrough. In particular, it relates to such bridge circuits wherein the residual voltage may cause undesired conduction of a switching element in the bridge circuit.

BACKGROUND AND PRIOR ART

In German DT/OS 2,350,958 a bridge circuit is disclosed which controls the direction of current through a servomotor and which has four switching transistors constituting the arms of the bridge. However, to prevent short circuits of the supply line, two additional transistors are used so that each of the control signals which determines the direction of current through the motor is simultaneously applied to two transistors each of which is to become conductive for the particular current direction.

THE INVENTION

It is an object of the present invention to provide a bridge circuit of the above described type which, however, requires only four transistors.

Briefly, the present invention comprises at least one rectifier element connected between one output terminal of the electrical component having the residual voltage and the control electrode of one switching element connected in the bridge circuit in such a manner that the residual voltage is blocked from the control electrode. In a preferred embodiment the electrical component is a servomotor and the rectifier element is a diode. Further, a second rectifier element, preferably also a diode, is connected between the second output terminal of the motor and the control electrode of a second one of the switching elements. Again, the polarity of the rectifying element is such that the residual voltage (motor EMF) is blocked from the control electrode.

The preferred embodiment of the invention is shown in the single FIGURE.

In the FIGURE, the supply voltage is furnished between a terminal 10 and a reference terminal, R. A series circuit including the emitter-collector circuit of a transistor 11, a diode 12, and the emitter-collector circuit of a transistor 13 is connected between terminal 10 and terminal R. Transistor 11 is a PNP transistor, while transistor 13 is a NPN transistor. Also connected from terminal 10 to terminal R is the emitter-collector circuit of a PNP transistor 14, a diode 17, and the emitter-collector circuit of an NPN transistor 15. Each of the transistors constitutes one arm of a bridge circuit. A motor 16 is connected in the detecting branch of the bridge circuit, that is between the collector of transistor 11 and that of transistor 14. In a preferred embodiment, motor 16 is a servomotor. However, the present invention is not to be limited to motors since any electrical component whose voltage decreases slowly after current shut off is equally applicable. A collector of transistor 13 is connected through a resistor 18 to the base of transistor 14. Similarly, the collector of transistor 15 is connected through a resistor 19 to the base of transistor 11. Two input terminals, 20, and 21 are provided. Terminal 20 is connected through a resistor 22 to the base of transistor 14, while terminal 21 is connected through a resistor 23 to the base of transistor 15.

OPERATION

If a positive control signal is applied at terminal 21, transistor 15 becomes conductive, causing transistor 11 to become conductive, since its base voltage is now negative with respect to its emitter voltage. Current flows from terminal 10 through the emitter-collector circuit of transistor 11, through motor 16, diode 17 and the emitter-collector circuit of transistor 15 to the reference terminal which, may for example, be ground potential. Current thus flows through motor 16 in a first direction. In the absence of a signal at terminal 21, but the presence of a signal at terminal 20, transistor 15 and 11 are blocked, while transistors 14 and 13 become conductive, causing current to flow through transistor 14, motor 16, diode 12 and transistor 13 to the reference or ground potential. Current thus will flow in a direction opposite to the first direction through motor 16. This causes the direction of rotation of the motor to change. However, when the control signal is switched rapidly from terminal 21 to terminal 20, the motor will, for a short time maintain its direction of rotation thereby causing an electromotive force to be generated which, in the absence of diode 17, would cause a negative potential to be applied to the base of transistor 11, maintaining it in the conductive state. Without diode 17, transistors 11 and 13 could thus be conductive simultaneously, thereby short-circuiting line 10. Diodes 17 and 12 therefore prevent possible short-circuiting of the line by blocking the motor EMF from the base of the transistors which might otherwise be switched to the conductive state at the wrong time.

Even when no control signals are supplied, the above described circuit is short circuit proof. It is also safe with respect to inadvertent polarity reversals.

Various changes and modifications may be made within the scope of the inventive concept.

We claim:

1. A control system for connection to a voltage source (10, R) having a first, second, third and fourth controlled switching element (11, 13, 14, 15) connected to form, respectively, the first, second, third and fourth arm of a bridge circuit, at least one of said switching elements (14) having a control electrode connected to an arm of the bridge circuit other than the arm of which the respective switching element is a part;

an electrical component (16) connected in the detecting branch of said bridge circuit, said electrical component furnishing a residual voltage of polarity opposite to the voltage source after termination of current flow therethrough; and at least one rectifier element (12) connected between one terminal of said electrical component and said control electrode of said at least one controlled switching element, wherein, in accordance with the invention, the rectifier element (12) is poled in a direction to block said residual reverse polarity voltage from said control electrode.

2. A system as set forth in claim 1, wherein said first and second switching elements (11, 13) are connected in series; and wherein said rectifier element (12) is interconnected between said first and second switching element.

3. A system as set forth in claim 1, wherein said first, second, third and fourth switching element (11, 13, 14, 15) each have a control electrode;
wherein said at least one rectifier element constitutes a first rectifier element (12);
wherein said first switching element (11), said first rectifier element (12) and said second switching element (13) are connected in series;
further comprising a second rectifier element (17);
wherein said third switching element (14), said second rectifier element (17) and said fourth switching element (15) are connected in series;
wherein said electrical component (16) has a first terminal connected to the junction of said first rectifier element (12) and said first switching element (11) and a second terminal connected to the junction of said second rectifier element (17) and said third switching element (14);
further comprising means (19, 18) for connecting
(a) the junction of said second rectifier element (17) and said fourth switching element (15) to said control electrode of said first switching element (11); and (b) the junction of said first rectifier element (12) and said second switching element (13) to the control electrode of the third switching element (14);
and wherein both said rectifier elements (12, 17) are poled in a direction counter to the polarity of the voltage source, whereby said thus reversely poled rectifier elements (12, 17) will block said residual reverse polarity voltage from the control electrodes of the first and third switching elements (11, 14).

4. A system as set forth in claim 3, further comprising means (20, 21) applying control signals for controlling said electrical components to said control electrodes of said second and fourth switching elements (13, 15).

5. A system as set forth in claim 4, wherein said first and second switching elements are transistors of opposite conductivity types.

6. A system as set forth in claim 4, wherein said first, second, third and fourth switching elements are transistors;
and wherein said first and second rectifier elements are diodes poled in opposition to the polarity of said residual reverse polarity voltage.

7. Apparatus for controlling the direction of current through a motor (16) which generates a counter-emf forming a decreasing residual reverse polarity voltage upon termination of current flow therethrough, said apparatus having
a first (11), second (13), third (14) and fourth (15) controlled switching element, each of said switching elements having a control electrode;
said switching elements being connected to said motor in a bridge circuit, said motor having a first and second terminal, respectively connected to said switching elements to form the diagonal of the bridge;
means (20, 22, 21, 23) selectively connected to and controlling the control electrodes of the second and fourth switching element (13, 15) to respectively become conductive upon receipt of a first, or second respective control signal, respectively applied to the second or fourth switching element, thereby causing current to flow in a first direction through said motor in response to a first control signal applied to the second switching element (13) or current to flow through said motor in a direction opposite to said first direction upon application of a second control signal to the fourth switching element (15);
first coupling means (18) coupling the control electrode of the third switching element (14) to the second switching element to control the third switching element to conduction when the second switching element (13) is controlled to conduction by the first control signal;
second coupling means (19) coupling the control electrode of the first switching element (11) to the fourth switching element (15) to control the first switching element to conduction when the fourth switching element (15) is controlled to conduction by the second control signal;
and first and second unidirectional blocking means (12, 17);
wherein, in accordance with the invention,
the first unidirectional blocking means (12) is connected between the first terminal of said motor and the junction of said first coupling means (18) and said second switching means (13) and poled to block the counter-emf of said motor upon continued rotation thereof after termination of said first control signal to said second switching element (13) from the control electrode of the third switching element (14) through said second coupling means;
and the second unidirectional blocking means (17) is connected between the second terminal of said motor and the junction of the fourth switching element (15) and poled in a direction to block the counter-emf of said motor upon continued rotation thereof after termination of the second control signal applied to the control electrode of the fourth switching element (15) through said second coupling means (19) to the control electrode of the first switching element (11),
whereby said first and second blocking means (12, 17) prevent undesired simultaneous conduction of said first and third and second and fourth switching elements, respectively.

8. Apparatus for controlling the direction of current through a motor (16) which generates a counter-emf forming a decreasing residual reverse polarity voltage upon termination of current flow therethrough, said apparatus having
a first (11), second (13), third (14) and fourth (15) transistor, each having its emitter-collector path connected in a bridge circuit,
the motor (16) having its terminals connected across a diagonal of the bridge;
control signal supply means (20, 22; 21, 23) connected to and controlling the conduction state of a transistor (13, 15) each, in an arm of the bridge;
cross coupling means (18, 19) coupling the arms of the bridge which include each of the respective control transistors (13, 15) to the bases of the other transistors (14, 11) in the respective other branches of the bridge;
and blocking diode means (12, 17) serially connected between the motor-bridge circuit junction and said coupling means (18, 19) and poled to block application of counter-emf from the motor upon continued rotation of the motor to the bases of said other transistors (14, 11) in the absence of a control signal from said control signal supply means commanding such rotation.

9. Apparatus according to claim 8, wherein the first and second transistors (11, 13) and the third and fourth transistors (14, 15), respectively, are complementary.

* * * * *